(12) United States Patent
Shacham et al.

(10) Patent No.: US 7,401,305 B2
(45) Date of Patent: Jul. 15, 2008

(54) ADAPTIVE APPLICATION OF SAT SOLVING TECHNIQUES

(75) Inventors: Ohad Shacham, Kfar Monash (IL); Karen Frida Yorav, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 11/178,723

(22) Filed: Jul. 11, 2005

(65) Prior Publication Data

US 2007/0011629 A1      Jan. 11, 2007

(51) Int. Cl.
G06F 17/50 (2006.01)
G06F 9/45 (2006.01)

(52) U.S. Cl. .................................... 716/5; 716/3; 716/4
(58) Field of Classification Search .................. 716/3–5, 716/18; 714/738
See application file for complete search history.

(56) References Cited

U.S. PATENT DOCUMENTS

| | | | | |
|---|---|---|---|---|
| 6,496,961 | B2 * | 12/2002 | Gupta et al. | 716/5 |
| 6,651,234 | B2 * | 11/2003 | Gupta et al. | 716/7 |
| 6,728,939 | B2 * | 4/2004 | Johannsen | 716/5 |
| 6,944,838 | B2 * | 9/2005 | McMillan | 703/2 |
| 7,028,279 | B2 * | 4/2006 | Jain et al. | 716/5 |
| 7,047,139 | B2 * | 5/2006 | Shtrichman | 702/22 |
| 7,203,917 | B2 * | 4/2007 | Ganai et al. | 716/5 |
| 2002/0123867 | A1 * | 9/2002 | Shtrichman | 703/2 |
| 2006/0031730 | A1 * | 2/2006 | Hsiao et al. | 714/738 |

OTHER PUBLICATIONS

Bryant, "Graph-based Algorithms for Boolean Function Manipulation," IEEE Transactions on Computers, (35:8), Aug. 1986, pp. 677-691.
Biere et al., "Symbolic Model Checking Without BDDs," Tools and Algorithms for the Construction and Analysis of Systems Fifth International Conference (TACAS'99) vol. 1579 of Lecture Notes in Computer Science, Jul. 1999, pp. 193-207.
Davis et al., "A machine program for theorem-proving," Communications of the ACM, (5:7), pp. 394-397, Jul. 1962.
Merques-Silva and Sakallah, "Grasp: A Search Algorithm for Propositional Satisfiability," IEEE Transactions on Computers, (48:5), May 1999, pp. 506-521.
Moskewicz et al., "Chaff: Engineering and Efficient SAT Solver," Proceedings of the 38th Annual IEEE/ACM Design Automation Conference (DAC'2001), Las Vegas, Nevada, Jun. 2001.
Goldberg and Novikov, "BerkMin: A Fast and Robust SAT Solver," Proceedings of the Design Automation and Test in Europe (Date'2002) Conference, Paris, France, Mar. 2002, pp. 142-149.

(Continued)

*Primary Examiner*—Jack Chiang
*Assistant Examiner*—Nghia M Doan

(57) ABSTRACT

A computer-implemented method for solving a satisfiability (SAT) problem includes defining a formula, including variables, which refers to properties of a target system. Using a chosen search strategy, a search process is performed over possible value assignments of the variables for a satisfying assignment that satisfies the formula. A performance metric estimating an effectiveness of the search process is periodically evaluated during the search process. The strategy of the search process is modified responsively to the evaluated performance metric. The method determines, using the search process, whether the formula is satisfiable on the target system.

9 Claims, 2 Drawing Sheets

OTHER PUBLICATIONS

Zhang, "SATO: An Efficient Propositional Prover," Proceedings of the 14th International Conference on Automated Deduction, Townsville, Australia, Jul. 1997, pp. 272-275.

Nudelman et al., "SATzilla: An Algorithm Portfolio for SAT," SAT 2003 Competition, in conjunction with the Sixth International Conference on the Theory and Applications of Satisfiability Testing.

Ryan, "Efficient Algorithms for Clause-Learning SAT Solvers," M.Sc. Thesis, Simon Fraser University, Burnaby BC, Canada, Feb. 2004.

Lagoudakis and Littman, "Learning to Select Branching Rules in the DPLL Procedure for Satisfiability," Electronic Notes in Discrete Mathematics (ENDM), vol. 9, LICS 2001 Workshop on Theory and Applications of Satisfiability Testing (SAT 2001), Boston.

Bayardo and Schrag, "Using CSP Loop-Back Techniques to Solve Real-World SAT Instances," Proceedings of the 14th National Conference on Artificial Intelligence, Providence, Rhode Island, Jul. 1997, pp. 203-208.

Herbstritt and Becker, "Conflict-Based Selection of Branching Rules," Proceedings of the Sixth International Conference on Theory and Application in Satisfiability Testing (SAT'2003), Santa Margherita Ligure, Italy, May 2003, pp. 441-451.

Aloul et al., "Satometer: How Much Have We Searched?" IEEE Transactions on Computer-Aided Design of Integrated Circuits and Systems, (22:8), Aug. 2003, pp. 995-1004.

Rule-Base parallel edition (RuleBase PE) formal verification tool produced by IBM Corporation (Armonk, New York), details at, www.haifa.il.ibm.com/projects/verification/RB_Homepage, printed Jan. 21, 2008.

McMillan, "Interpolation and SAT-based Model Checking," Proceedings of the Fifteenth Conference on Computer-Aided Verification (CAV'03), Boulder, Colorado, Jul. 2003, (in vol. 2725 of Lecture Notes in Computer Science, Somenzi and Hunt, eds., pp. 1-13).

* cited by examiner

ADAPTIVE APPLICATION OF SAT SOLVING TECHNIQUES

FIELD OF THE INVENTION

The present invention relates generally to hardware design verification, and particularly to methods and systems for performing bounded model checking by solving satisfiability problems.

BACKGROUND OF THE INVENTION

Various methods are known in the art for verifying complex hardware and logic designs. Some verification applications (commonly referred to as model checking methods) model the design as a finite state machine and express the hardware specification in temporal logic. For many designs, the number of states in such state machine can be prohibitive, and the explicit traversal of the state space becomes infeasible. To reduce the number of states, some applications use symbolic model checking methods, which encode the finite state machine in terms of Boolean formulas. Some symbolic model checking methods use binary decision diagrams (BDDs) for representing Boolean formulas. BDDs are described, for example, by Bryant in "Graph-based Algorithms for Boolean Function Manipulation," IEEE Transactions on Computers, (35:8), August 1986, pages 677-691.

Bounded Model Checking (BMC) is a symbolic model checking method introduced by Biere et al. in "Symbolic Model Checking Without BDDs," Tools and Algorithms for the Construction and Analysis of Systems Fifth International Conference (TACAS'99) volume 1579 of Lecture Notes in Computer Science, July 1999, pages 193-207. Bounded model checking is based on propositional satisfiability (SAT) procedures. The method considers counterexamples of a particular length and generates a propositional formula that is satisfiable if and only if such a counterexample exists. The authors show that bounded model checking for linear temporal logic (LTL) can be reduced to propositional satisfiability in polynomial time.

Many satisfiability solving methods are based on variants of the well-known Davis-Putnam-Longman-Loveland (DPLL) algorithm, which is described by Davis et al. in "A machine program for theorem-proving," Communications of the ACM, (5:7), pp. 394-397, July 1962.

Various methods and software tools are known in the art for solving propositional satisfiability (SAT) problems. For example, Merques-Silva and Sakallah describe a SAT solver called GRASP (Generic seaRch Algorithm for the Satisfiability Problem) in "GRASP: A Search Algorithm for Propositional Satisfiability," IEEE Transactions on Computers, (48:5), May 1999, pages 506-521.

Another SAT solver is described by Moskewicz et al. in "Chaff: Engineering an Efficient SAT Solver," Proceedings of the $38^{th}$ Annual IEEE/ACM Design Automation Conference (DAC'2001), Las Vegas, Nev., June 2001.

Goldberg and Novikov describe a tool called BerkMin in "BerkMin: A Fast and Robust SAT Solver," Proceedings of the Design Automation and Test in Europe (DATE'2002) Conference, Paris, France, March 2002, pages 142-149.

Yet another SAT solver called SATO is described by Zhang in "SATO: An Efficient Propositional Prover," Proceedings of the 14th International Conference on Automated Deduction, Townsville, Australia, July 1997, pages 272-275.

Nudelman et al. describe a tool called SATzilla, which aggregates several SAT solvers, in "SATzilla: An Algorithm Portfolio for SAT," SAT 2003 Competition, in conjunction with the Sixth International Conference on the Theory and Applications of Satisfiability Testing. SATzilla is a portfolio of SAT algorithms (including, for example, SATO and BerkMin cited above). The authors describe a method that predicts the running time of each algorithm for a given SAT instance and runs the algorithm predicted to be fastest.

In some cases, SAT solvers use heuristics and learning techniques for reducing the time and memory requirements of the solving process. For example, The BerkMin SAT solver cited above uses decision-making procedures, non-chronological backtracking, conflict analysis and clause database management as part of the solving process.

Several learning techniques and decision strategies are described by Ryan in "Efficient Algorithms for Clause-Learning SAT Solvers," M. Sc. Thesis, Simon Fraser University, Burnaby BC, Canada, February 2004.

Lagoudakis and Littman describe a method for choosing appropriate branching rules in a DPLL SAT solver in "Learning to Select Branching Rules in the DPLL Procedure for Satisfiability," Electronic Notes in Discrete Mathematics (ENDM), Volume 9, LICS 2001 Workshop on Theory and Applications of Satisfiability Testing (SAT 2001), Boston, Mass., June 2001. The method uses a reinforcement-learning approach, in which a value function, which predicts the performance of each branching rule in each case, is learned through trial runs on a typical problem set of the target class of SAT problems.

Bayardo and Schrag describe a method that incorporates constraint satisfaction problem (CSP) look-back techniques to enhance the Davis-Putnam procedure in "Using CSP Loop-Back Techniques to Solve Real-World SAT Instances," Proceedings of the $14^{th}$ National Conference on Artificial Intelligence, Providence, R.I., July 1997, pages 203-208.

Herbstritt and Becker describe another method for branching rule selection in "Conflict-Based Selection of Branching Rules," Proceedings of the Sixth International Conference on Theory and Application in Satisfiability Testing (SAT'2003), Santa Margherita Ligure, Italy, May 2003, pages 441-451. The method uses a set of branching rules. Each branching rule is given a preference value, which models the probability of selecting the branching rule. The preference values are dynamically adapted with respect to conflict analysis. Learning methods and decision strategies are also described in the above-cited references regarding BerkMin, GRASP, chaff, SATO SAT solvers.

Aloul et al. describe a tool for estimating the progress of a SAT solver in "Satometer: How Much Have We Searched?" IEEE Transactions on Computer-Aided Design of Integrated Circuits and Systems, (22:8), August 2003, pages 995-1004. Satometer estimates the percentage of the search space actually explored by a Boolean satisfiability (SAT) solver that uses conflict clause learning. The tool calculates a normalized count for portions of the search-space identified by conflicts. The computation is carried out using a zero-suppressed BDD data structure.

SUMMARY OF THE INVENTION

There is therefore provided, in accordance with an embodiment of the present invention, a computer-implemented method for solving a satisfiability (SAT) problem, including defining a formula, including variables, which refers to properties of a target system. Using a chosen search strategy, a search process is performed over possible value assignments of the variables for a satisfying assignment that satisfies the formula. A performance metric estimating an effectiveness of the search process is periodically evaluated during the search process. The strategy of the search process is modified responsively to the evaluated performance metric. The method determines, using the search process, whether the formula is satisfiable on the target system.

Apparatus and a computer software product for solving a satisfiability (SAT) problem are also provided.

There is also provided, in accordance with an embodiment of the present invention, a method for bounded model checking (BMC) of a hardware device. The method includes providing a hardware model representing the device and providing one or more properties representing specifications of the device. Responsively to the design model and to at least one of the properties, a BMC instance, including a formula over variables, is produced. Using a chosen search strategy, a SAT solver performs a search process over possible value assignments of the variables for a satisfying assignment that satisfies the formula. During the search process, the SAT solver periodically evaluates a performance metric estimating an effectiveness of the search process and modifies the strategy of the search process responsively to the evaluated performance metric. Based on the search process, it is determined whether the hardware model satisfies the at least one of the properties.

The present invention will be more fully understood from the following detailed description of the embodiments thereof, taken together with the drawings in which:

DETAILED DESCRIPTION OF EMBODIMENTS

Overview

Figure 1:
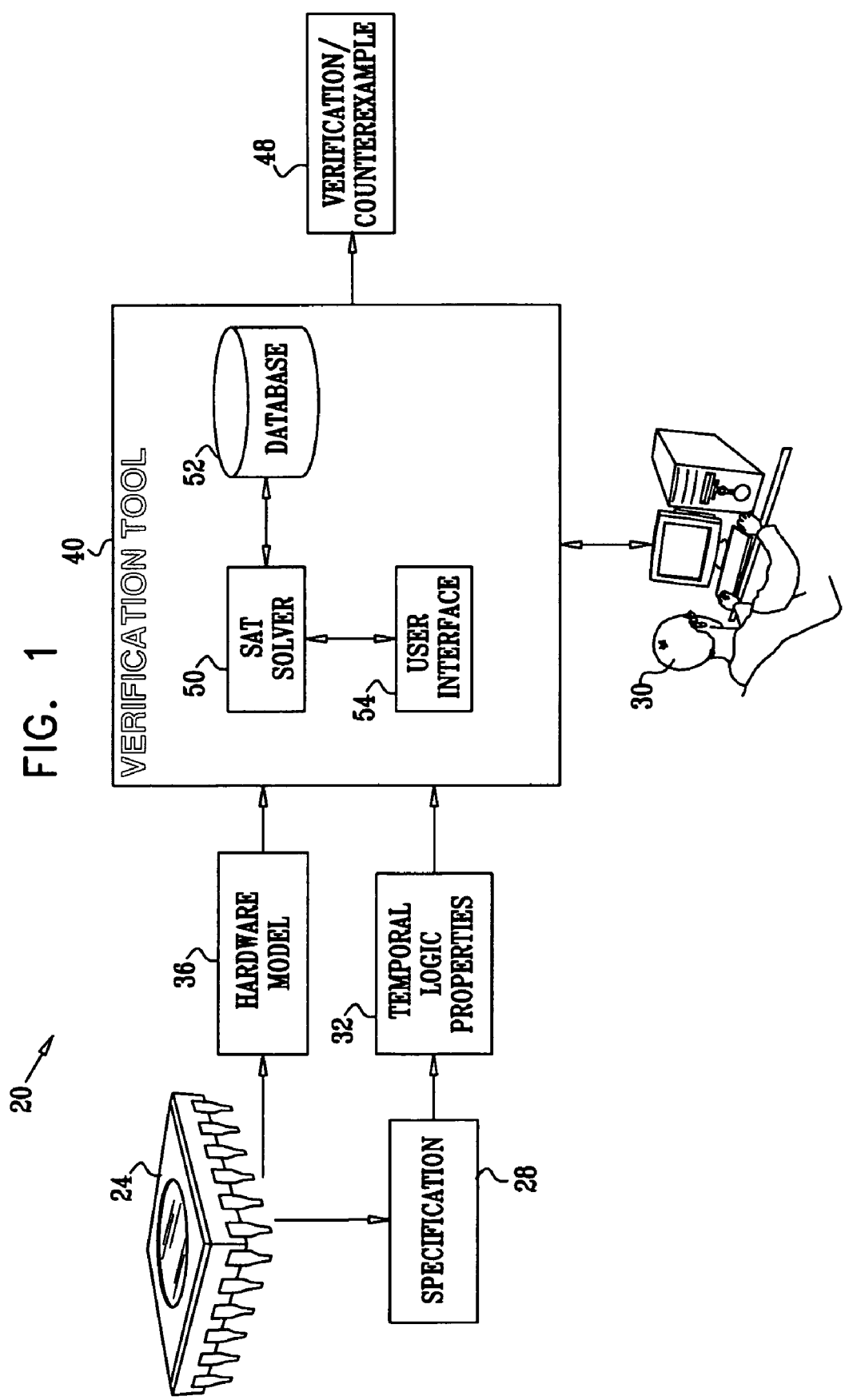
FIG. 1 is a block diagram that schematically illustrates a system for design verification, in accordance with an embodiment of the present invention.

When searching for a solution to a satisfiability problem, conventional SAT solvers typically apply various heuristics and strategies in order to restrict the sub-space of solutions that needs to be searched. Formulas generated by BMC verification problems often comprise millions of variables and clauses. Therefore, it is highly desirable to restrict the search to the extent possible, in order to perform BMC within reasonable computation time and memory size.

Experience shows that selecting the appropriate strategy for a given formula is a complicated task. The performance of a given strategy is highly dependent on the specific formula, in ways that are often difficult to predict. A strategy that is successful for a certain formula may be inefficient for another.

Some SAT solvers choose or improve a certain strategy by "training" it over a training set of SAT instances. In many cases, however, training does not improve the solver's performance because the correlation between the training set and real-life SAT instances is often limited.

Typically, SAT solvers that solve BMC problems process large numbers of formulas, whose satisfiability needs to be checked. These formulas may differ significantly from one another in terms of the number of clauses, the number of variables and their interrelationships. Using a single strategy for processing the entire body of formulas can thus be inefficient.

In view of these limitations of the prior art, embodiments of the present invention provide methods and systems for adaptive SAT solving. In principle, the methods described herein continuously monitor the performance and effectiveness of the search process carried out by the SAT solver. A large variety of strategies can be activated, deactivated or otherwise adapted, as appropriate for improving the search performance. (The terms "search performance" and "search effectiveness" used herein typically refer to the computation time and/or the memory size required by the solver to implement the search.)

In some embodiments, the solver matches the strategy used in the search process to the actual formula being processed, often using different strategies in different parts of the same formula. As the search continues, different strategies are turned on and off. If a certain strategy proves to be successful, it is typically retained. Strategies that prove to be unsuccessful are turned off. In some cases, a strategy that was found to be inefficient in one part of the search can be found to be highly efficient, and be activated and used, in another part of the search, all within the same formula.

In some embodiments, the solver periodically evaluates one or more performance metrics that estimate the effectiveness of the search. Typically, the solver divides the search into segments and evaluates the performance metrics after processing each segment. The evaluated metrics are compared to a predetermined switching condition. If the switching condition is met, the solver switches to a different strategy before processing the next search segment. Otherwise, the existing strategy is retained.

In some embodiments, the disclosed SAT solver can use strategies that are detrimental in most scenarios and beneficial only in a small number of cases. Because of the use of metric-based switching, such strategies are activated and used when expected to be beneficial, and deactivated when proven harmful.

Several exemplary performance metrics, switching conditions and strategies are described hereinbelow. An experimental system for adaptive SAT solving is also described. Experimental results of adaptive solving of BMC-related formulas are shown and analyzed for several performance metrics. Search speed-up improvements of 50-60% are demonstrated for a representative benchmark suite, typical of BMC projects. For individual formulas, improvements of up to 12× are shown.

System Description

FIG. 1 is a block diagram that schematically illustrates a system 20 for bounded model checking (BMC) of a hardware device 24, in accordance with an embodiment of the present invention. Device 24 may comprise an integrated circuit (IC), an application-specific IC (ASIC), a field-programmable gate array (FPGA), a microprocessor, or any other suitable digital hardware device or target system. A specification 28 defines the functional behavior and/or the performance that the design is expected to fulfill. In order to verify the design of device 24, a user 30, typically a verification engineer, converts the specification into properties 32, typically written in temporal logic. Temporal logic, as is known in the art, is a specification language suitable for expressing relationships between the variables of the design over time.

A hardware model 36 of device 24 is created, which typically represents the hardware as a finite state machine. Model 36 is typically written in a suitable hardware description language (HDL), such as VHDL or Verilog. Model 36 is then tested by a BMC verification tool 40 to ascertain that model 36 satisfies all of properties 32 under all possible input sequences. Alternatively, tool 40 may find a violating counterexample. A counterexample is an input sequence and a particular succession of state transitions in model 36 that lead to violation of one or more of properties 32.

It is well known in the art that the problem of testing a device using BMC can be formulated in terms of an equivalent SAT problem. This property is described, for example, in the paper by Biere et al. cited above. As a result, many BMC verification tools incorporate SAT solvers. An exemplary verification tool that uses BMC is the RuleBase parallel edition (RuleBase PE) formal verification tool produced by IBM Corporation (Armonk, N.Y.). Further details regarding this product can be found at www.haifa.il.ibm.com/projects/verification/RB_Homepage.

BMC methods consider only counterexamples up to a particular length k (in other words, state transition sequences in the hardware model of length k or less) and generate a Boolean formula (referred to as a "BMC instance") that is satisfiable if and only if such a counterexample exists. Specifically, as part of the BMC process, tool 40 attempts to find a counterexample that violates a particular property p in properties 32. Tool 40 generates the BMC instance, which is satisfiable if and only if there exists a state in model 36, reachable within k transitions or less, which contradicts property p. In other words, satisfying the Boolean formula is equivalent to finding a counterexample to p.

Tool 40 comprises a SAT solver 50. Solver 50 accepts the Boolean formula (also referred to as a "SAT instance") and attempts to satisfy it, i.e., to find a counterexample. Solver 50 adaptively applies different SAT solving strategies in order to speed-up the solving process, as will be described in detail below. Solver 50 uses a clause database 52 for storing the clauses of the Boolean formula, as well as search-related information, during the solving process. User 30 interacts with tool 40 using a suitable user interface 54. User interface 54 is an exemplary type of an input interface, which is operated by user 30 for entering the formula or formulas to be solved by solver 50. In other embodiments, in which the formula or formulas are provided to solver 50 from another computer or system, the input interface comprises a suitable machine interface (not shown).

Tool 40 produces an output 48. Output 48 may comprise a counterexample, if one is found, or an indication that no counterexample could be found. In some embodiments, solver 50 terminates the solving process without finding a counterexample, after a predetermined timeout or due to a memory limitation.

Typically, SAT solver 50 comprises a general-purpose computer, which is programmed in software to carry out the functions described herein. The software may be downloaded to the computer in electronic form, over a network, for example, or it may alternatively be supplied to the computer on tangible media, such as CD-ROM. Further alternatively, solver 50 may be implemented using a combination of hardware and software elements. The solver may be a standalone unit, or it may alternatively be integrated with other components of tool 40.

In some embodiments, solver 50 may comprise a modified version of a conventional solver, such as the Chaff, GRASP, BerkMin or SATO solvers cited above. Such conventional solver can be modified to apply adaptive solving, as explained below.

SAT Problem Formulation and DPLL-Style Solving

Given a Boolean formula F over a set of Boolean variables V, SAT solver 50 attempts to find an assignment to all variables in V such that F is satisfied. (Such an assignment is referred to as a satisfying assignment.) Formula F is typically represented in Conjunctive Normal Form (CNF). In CNF representation, F is written as a conjunction (AND) of clauses, wherein each clause is a disjunction (OR) of literals. A literal is an instance of a Boolean variable x, or its negation $\bar{x}$. A literal may take one of three possible values: true, false or undefined. A clause in which exactly one literal is undefined and all the other literals are false is called a unit clause. In order to satisfy a unit clause, the last undefined literal must be set to true. It is well known in the art that any Boolean formula can be represented in CNF. When using the CNF representation, formula F is satisfied if and only if all of its clauses are satisfied. A clause is satisfied if and only if at least one of its literals is true. The clauses of formula F, referred to as "original clauses," are typically stored in clause database 52.

Finding a satisfying assignment for a formula having n variables can be seen as a search process over the n-dimensional space of possible assignments. In many practical block-level or unit-level BMC cases, the Boolean formula may comprise tens of millions of variables and hundreds of millions of clauses. Complete chip-level verification projects can be several orders of magnitude larger. An exhaustive search of this size is thus unfeasible within a reasonable time scale, computational power and memory size.

The DPLL solving process carried out by solver 50 is an iterative search process. In some embodiments, solver 50 comprises a DPLL-style solver (i.e., a SAT solver that uses variants of the DPLL method, originally described in the paper by Davis et al. cited above). Typically, solver 50 attempts to reduce the computation time and memory requirements of the search process by employing various heuristics and learning methods. In some cases, iterations of the search process learn from conflicts encountered by previous iterations, thereby limiting the remaining subspace that needs to be searched. This feature is referred to as "clause learning." The DPLL process with clause learning typically comprises the following steps:

Decision and assignment. The solver selects an unassigned variable and decides whether to set it to true or false. The method that decides which variable to select and which value to assign to it is called a "decision heuristic." The solver assigns the appropriate values to all literals of the chosen variable in the various clauses of formula F. At any given time, the number of values assigned by decisions and not yet undone is the "decision level". The decision level can be reduced by backtracking, as will be described below.

Boolean constraint propagation (BCP). Each assignment has implications across the various clauses of formula F. For example, some clauses may become unit as a result of the assignment. Following each decision, the solver invokes a BCP process, which is a process of propagating the implications of the decision across the formula. For example, whenever the decision causes a particular clause to become unit, the last undefined variable in this clause should be assigned with a true value, otherwise the clause cannot be satisfied. Such an assignment is called a "forced assignment." The forced assignment may in turn cause other clauses to become unit, resulting in additional forced assignments. The BCP process continues until a satisfying assignment is found, until a conflict is encountered or until no further assignments can be deduced.

Conflict analysis. A conflict occurs when the BCP process propagates a certain assignment and discovers a clause having all its literals set to false. Equivalently, the BCP process may discover two conflicting clauses (i.e., two clauses comprising literals of a certain variable. In one of the clauses, the variable should be set to true to satisfy the clause, while in the other clause the same variable should be set to false.) When a conflict is encountered, the solver analyzes the sequence of implications that led to the conflict. The reasons for the conflict are summarized in a "conflict clause" that is added to clause database 52. The conflict clauses are used by future iterations of the solving process, in order not to repeat the combination of assignments that resulted in the conflict. Thus, using conflict clauses effectively prunes the search space that remains to be searched.

Backtracking. Following a conflict, the search process returns to a previous decision level, in which the conflict no longer exists. Typically, the solver cancels all assignments made between this decision level and the point of conflict. From this stage, a different decision is taken and the solving process continues in another subspace of the search space.

Restart. In some cases, the solver terminates the sequence of assignments and "restarts" the process from decision level zero, using a different selection of variables. The information learned so far, in particular the conflict clauses, is retained and used in the restarted process. The restart operation sometimes improves the effectiveness of the search, as it begins from a different subspace that was not searched before.

The iterative searching process of decisions, BCP, conflict analysis and backtracking is typically continued until a satisfying assignment (a counterexample) is found or until the entire search space is searched and the formula is proven to be unsatisfiable. The following pseudo-code demonstrates the DPLL search process with learning:

```
while (1) {
    if (decide_next_branch( ))
        while (deduce( ) == CONFLICT) {
            blevel = analyze_conflicts( );
            if (blevel == 0) return UNSAT;
            else backtrack(blevel);
        }
    else
        return SAT;
}
```

Function decide_next_branch( ) applies the decision heuristics so as to select a variable and assign a value to it. If all variables become assigned, the process halts and outputs the satisfying assignment. Otherwise, the implications of the assignment are propagated by the deduce( ) function. If deduce( ) encounters a conflict, the conflict is analyzed and one or more conflict clauses are added to the clause database. The function analyze_conflicts( ) returns a decision level, to which the process backtracks as a result of the conflict. If the returned decision level is zero, a conflict exists even without a single assignment. In this case, the formula is declared unsatisfiable. Otherwise, the process backtracks to decision level blevel and continues the search.

Although the methods and tools described herein refer to DPLL-style SAT solving methods that process formulas represented in CNF, this choice was made purely for the sake of conceptual clarity. Adaptation of these methods and tools to other SAT solving methods and to other formula representations is straightforward, based on the information and examples provided herein, and will be apparent to those skilled in the art.

Adaptive Solving

As noted above, conventional SAT solvers typically apply heuristics and strategies during the search process to limit the sub-space of assignments that needs to be searched. Such heuristics and strategies comprise, for example, decision heuristics (sometimes referred to as "branching rules"), BCP implementations, conflict analysis strategies, clause deletion strategies, restart heuristics, and various clause learning techniques. Parts of the search method often comprise numerical constants and thresholds, whose values can also be set in accordance with the desired strategy. In the context of the present patent application and in the claims, such heuristics, strategies, threshold values, parameters and other search characteristics are collectively referred to as "strategies."

In the adaptive solving method described hereinbelow, solver 50 evaluates during the search process one or more performance metrics that estimate the effectiveness of the search. In some embodiments, the solver evaluates the performance metrics after processing a predetermined number of decisions, referred to as a "search segment." The metric value typically depends on the computations performed by the solver during the segment. A typical segment size is 2048 decisions, although other suitable sizes can also be used. Some exemplary performance metrics are described below, with explanations of the underlying heuristic or strategy.

A decision level (DL) metric measures the average decision level in the segment. The solver typically reaches high decision levels when it is able to make a large number of decisions without conflicts. When the average decision level is high, the solver typically spends significant amounts of time in small parts of the search sub-space. A small average decision level, on the other hand, typically indicates a large number of conflicts encountered by the solver. Since conflicts are important for limiting the search sub-space that remains to be searched, a low average decision level is considered an indication of high search efficiency.

A conflict clause size (CCS) metric measures the average size of the conflict clauses added during the segment. The size is defined as the number of literals in the conflict clause. The underlying assumption is that smaller conflict clauses imply greater restrictions on the search sub-space. Smaller conflict clauses thus make the search more efficient. In some embodiments, the number of conflict clauses in the segment can also be used as a metric.

A binary conflict (BIN) metric measures the percentage of binary conflict clauses (i.e., conflict clauses comprising two literals) out of the total number of conflict clauses in the segment. Binary conflict clauses are a likely source of subsequent implications, since a single assignment causes such clause to become unit. It is assumed that a large percentage of binary conflict clauses significantly advances the search. (In some embodiments, the percentage of ternary conflict clauses, comprising three literals, is also used as a metric. In many practical cases, however, this metric is highly correlated with the BIN metric and does not contribute additional insight.)

In some embodiments, solver 50 defines a pair of literals in each clause as "watched literals." These literals should be initially set to true or undefined. During the search, solver 50 examines only the watched literals of each clause. As long as both watched literals remain true or undefined, the clause cannot become unit and there is no need to examine it during BCP. If a watched literal becomes false, the solver examines the clause to determine whether it has become unit.

In such embodiments, a BCP metric measures the ratio between the number of examined literals and the number of clauses visited in the segment. In other words, the metric measures the average number of literals examined per clause. This ratio is typically indicative of the speed at which implications are carried out. A low BCP metric value indicates an efficient BCP process. In many cases the BCP metric is particularly meaningful, since SAT solvers typically spend the majority of their computational time performing BCP.

In some embodiments, solver 50 can produce unary conflict clauses during the search. A unary conflict clause comprises a single literal, and indicates a value that a certain variable must take in order to satisfy the formula. The variable is then assigned a permanent value. When a unary conflict clause is added, the search process typically backtracks to decision level zero and applies BCP to discover all implications of this permanent assignment. Any subsequent forced assignment that results from this BCP process is also permanent.

A unary (UNARY) metric measures the number of permanent value assignments performed in the segment. In many practical cases, the unary metric exhibits highly bursty behavior. The bursty behavior is characterized by extended periods of time in which few or no permanent assignments are performed, followed by a sudden burst of assignments to several tens or hundreds of variables.

The performance metrics described above are exemplary metrics. Any other suitable metrics can be used by solver 50 to estimate the progress and effectiveness of the search process. It is generally desirable that performance metrics be capable of being calculated at run-time, incur small computational overhead, and be approximately correlated with the effectiveness of the search process. It should also be noted that measured metric values may differ significantly between different types of SAT solvers, depending on the internal structure of the solver.

Solver 50 uses the evaluated performance metrics of a particular search segment to determine whether the performance of the search process over this segment is satisfactory, or whether a change in strategy is desirable before continuing the search. In some embodiments, the solver evaluates a predetermined "switching condition," typically comprising a logical expression over one or more of the metrics. If the switching condition evaluates to true, a change in strategy is performed. If the condition evaluates to false, the solver retains the existing settings.

In some embodiments, the switching condition comprises a threshold set over one of the performance metrics. The value of the threshold can be determined by performing a large number of searches without adaptation and analyzing the values taken by the different metrics. For example, the searches can be classified as efficient searches that achieved low execution times, and inefficient searches that required long execution times. The metric values typical of efficient searches and those values typical for inefficient searches can be studied. The threshold value can then be set to an intermediate value. This method of determining thresholds is particularly suitable for the DL, CCS, BIN and BCP metrics. Alternatively, any other suitable method for setting threshold values can be used. Typically, the internal structure of the SAT solver used can influence the metric behavior. Therefore, determining threshold values for the metrics should also take into account the specific solver used.

For the UNARY metric, the switching condition sometimes takes into account several consecutive segments, because of the bursty behavior of this metric. An exemplary condition may be—"perform switching if in 14 out of the last 16 segments, less than 3 permanent assignments were added per segment." The numerical values in this condition can also be determined by analyzing the metric values evaluated on efficient and inefficient searches.

In many SAT problems, frequent switching of strategies may degrade the search performance. In other words, once a switch has been performed, it is sometimes desirable to freeze the new settings for a certain period of time, to allow the new strategy to take effect. In some embodiments, after a switch has been performed, the corresponding threshold value is modified (incremented or decremented as appropriate) so that another switch will occur only if the metric value deteriorates more severely. Additionally or alternatively, after a switch has been performed, subsequent switches can be masked or otherwise prevented for a predetermined number of segments or computations. Further additionally or alternatively, the total number of switches in a single search can be restricted to a maximum allowed value. Any other suitable method for limiting the frequency of strategy switching operations can also be used.

A large number of different strategies, heuristics, parameters and other characteristics of solver 50 can be adapted by switching operations. Typically, the adapted characteristic should have a significant impact on the effectiveness of the search. Strategies that are good candidates for switching are usually beneficial in some scenarios and harmful in others. In other words, if a given strategy is always beneficial, it is typically not a good candidate for switching—since it is more beneficial to switch it on constantly.

Unlike conventional SAT solvers, solver 50 can use strategies that are detrimental in most scenarios and beneficial only in a small number of cases. Because of the use of metric-based switching, such strategies will be used when expected to be beneficial and will be deactivated when they become harmful.

An exemplary parameter suitable for switching is described in the following example. In some conventional decision heuristics, when performing a decision, the solver first selects a variable to be assigned, and only then determines whether to set it to true or false. Consider a selected variable denoted x. One possible decision heuristic is to compare the number of occurrences of literal x with the number of occurrences of literal $\bar{x}$ in the entire formula. By default, if there are more occurrences of literal x in the formula, then variable x is set to true. If there are more occurrences of $\bar{x}$, the variable x is set to false. An alternative heuristic is to reverse the decision, i.e., set variable x to true if there are more occurrences of literal $\bar{x}$, and vice versa. This reversed strategy is referred to as the "-sign" option.

Experimentation shows that although the default decision heuristic is generally preferable, there are cases in which activating the "-sign" option speeds-up the search by as much as four times. Experimental results of adaptive solving by switching between the default decision heuristic and the "-sign" option are shown in the descriptions of FIGS. 3A-3F below.

The strategy switching method of activating or deactivating the "-sign" option is described purely as a clarifying example. Any other suitable adaptation of strategy, or combination of strategies, can also be used by solver 50. Alternative strategies that may be adapted comprise, for example:

Decision heuristics—criteria for selecting the next variable for assignment, and/or criteria for deciding whether to set it to true or false.

Clause addition and deletion strategies—criteria and strategies relating to the addition and deletion of clauses from clause database 52 during the search.

Restart strategies—conditions for deciding to perform a restart of the search.

BCP—methods for propagating the effect of assignments and the data structures used by these methods.

Clause learning strategies—methods for analyzing conflicts and for generating conflict clauses.

Strategies for setting numerical constants, parameters and/or thresholds of strategies listed above.

Combinations of two or more strategies listed above.

Satisfiability Solving Method Description

Figure 2:
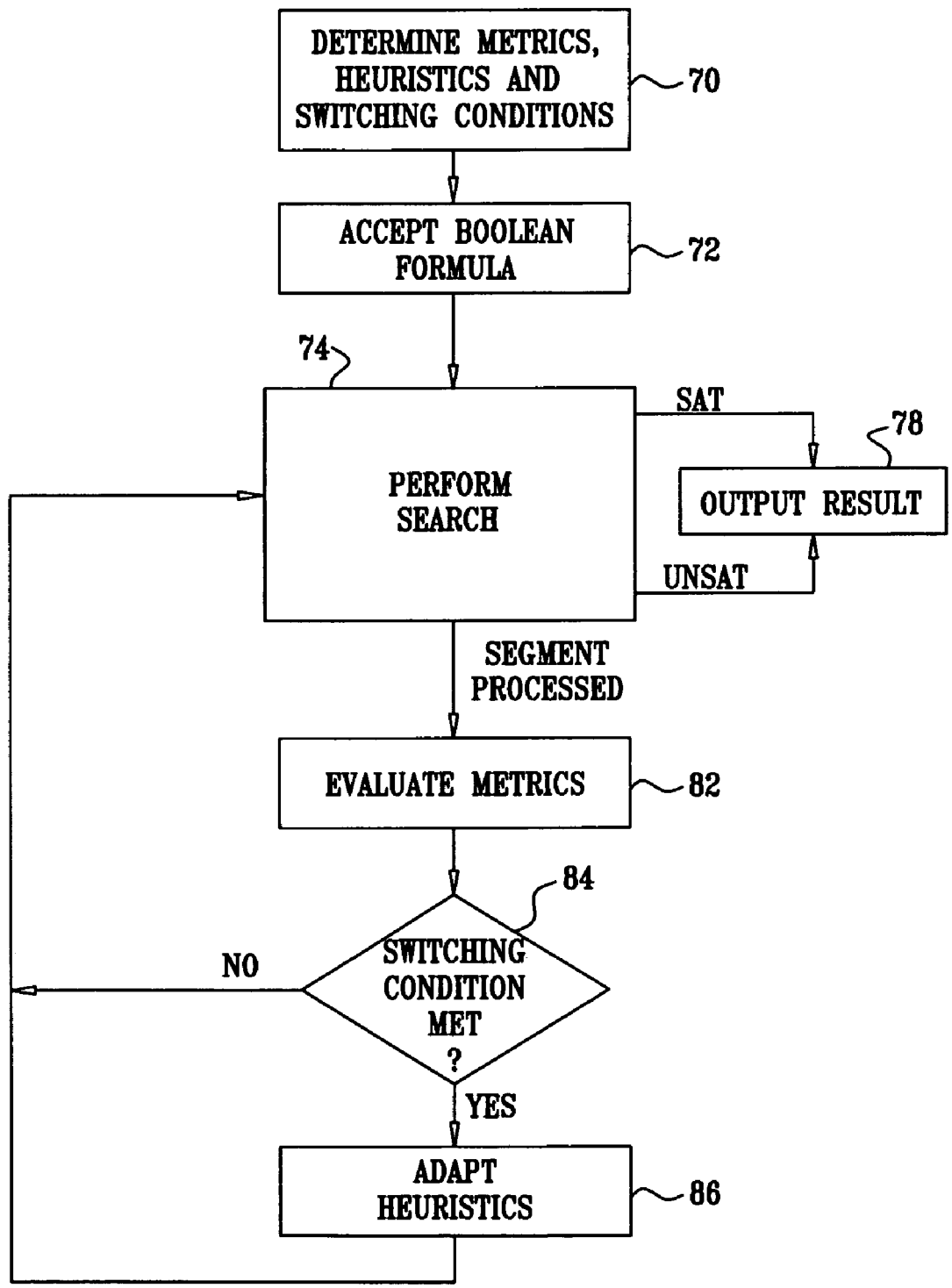
FIG. 2 is a flow chart that schematically illustrates a method for solving a satisfiability problem, in accordance with an embodiment of the present invention.

FIG. 2 is a flow chart that schematically illustrates a method for solving a satisfiability problem, in accordance with an embodiment of the present invention. The method begins with SAT solver 50 setting initial conditions for the search, at an initialization step 70. In some embodiments, the solver determines the various metrics, strategies and switching conditions to be used in the search. In other embodiments, the initial conditions are constant for all searches, and step 70 can be omitted. In some embodiments, some or all of the initial conditions are set by user 30 using user interface 54. In particular, the number of decisions defined as the segment size, denoted N, is defined.

Solver 50 accepts a Boolean formula, at a formula acceptance step 72. In some embodiments, the formula is produced by tool 40 as part of a BMC verification process. In some embodiments, a plurality of formulas is provided by tool 40 to solver 50. The solver then performs multiple runs of the method of FIG. 2, one run per each formula. In some embodiments, the formula is represented using CNF. Alternatively, the formula can be represented using any other suitable representation method.

Solver 50 performs a search process in order to find a satisfying assignment to the variables of the Boolean formula, at a searching step 74. In some embodiments, the search process comprises a variant of a DPLL search, as described and cited above. Searching step 74 can have three alternative outcomes:

If a satisfying assignment is found during the search, the solver terminates the search process and outputs the satisfying assignment, at an output step 78. In some embodiments, the satisfying example comprises a counterexample that violates one or more of properties 32.

Alternatively, if the solver encounters a conflict at a decision level of zero (in other words, a conflict that does not include any decisions) it concludes that the formula is unsatisfiable. In this case, solver 50 terminates and indicates that the formula was found to be unsatisfiable, at output step 78.

Further alternatively, if solver 50 performs N decisions without finding the formula to be either satisfiable or unsatisfiable, the solver checks whether a change in strategy is desired. The solver first evaluates one or more performance metrics, at a metric evaluation step 82. The solver evaluates the metric or metrics with respect to the previous N decisions, or the segment that has just been searched. In some embodiments, the solver evaluates a combination of one or more metric values, as defined in initialization step 70 above. Responsively to the evaluated metrics, solver 50 checks whether a switching condition is met, at a switch checking step 84.

If no switching is desired, the method returns to continue the search process at searching step 74, retaining the current strategy. If the switching condition evaluates to true, indicating that a strategy switch is desired, solver 50 performs the switch at an adaptation step 86, and then returns to step 74 to continue the search.

Experimental Results

The inventors implemented an experimental system for solving SAT-based BMC problems, using the adaptive solving method described in FIG. 2 above. The experimental system comprises a personal computer comprising an Intel® Pentium® 4 central processing unit (CPU) running at 2 GHz. The computer has 1 GB of memory and runs under a Linux® operating system. The SAT solver used for the experimental system is the SAT solver used in the IBM RuleBase PE verification tool cited above. This solver is a DPLL-style solver, which uses conflict clause learning and non-chronological backtracking.

A benchmark suite used by the experimental system comprises fifty Boolean formulas generated from real-life BMC cases. The suite is constructed to contain a diverse variety of formulas, including long and short formulas, satisfiable and unsatisfiable formulas and formulas of varying depth and complexity. All formulas in the suite are chosen so that the solver takes at least 20,000 decisions to solve them. Strategy switching was not allowed within the first 20,000 decisions. The time-out mechanism of the solver was disabled (or set to a sufficiently high value) to ensure that the measured computation time is the actual time needed for searching and is not influenced by time-out conditions.

The adaptive solving method of FIG. 2 above was used to solve the fifty formulas of the benchmark suite. Searches were performed using each of the performance metrics defined above, namely the DL, CCS, BIN, BCP and UNARY metrics.

The switched strategy in all experiments was activating or deactivating the "-sign" option in the decision heuristic, as described above. In other words, in each search, the appropriate metric was evaluated at the end of each search segment. The evaluated metric value was compared with the predetermined switching condition defined for that metric. If the switching condition was met, the decision heuristic for the continuation of the search was reversed. (If the solver used the default decision heuristic in the present segment, the decision heuristic is switched to use the "-sign" option, and vice versa.)

For each metric, the total computation time, accumulated over all fifty formulas in the benchmark suite, was used as a comparative benchmark. This benchmark was chosen because it is more indicative of the effectiveness of adaptive solving in real-life design verification projects comprising multiple, diverse formulas. This criterion inherently gives more weight to the larger formulas. This bias is desirable because it is generally desirable to reduce the overall computation time of a complete verification project, rather than optimizing the computation time of any single formula.

The total computation time of the adaptive search, using each metric separately, was compared to a "native" search without adaptation. A speed-up ratio, defined as the ratio between the computation times of the adaptive and the native search was calculated for each metric. The following table summarizes the resulting computation times (in seconds) and speed-up ratios:

| | Metric | Native | −Sign | DL | CCS | BIN | BCP | UNARY |
|---|---|---|---|---|---|---|---|---|
| UNSAT | Time | 8662 | 14579 | 8609 | 7726 | 6702 | 7057 | 7933 |
| | Speedup | — | 0.594 | 1.006 | 1.121 | 1.292 | 1.227 | 1.091 |
| | Min | — | 0.097 | 0.771 | 0.874 | 0.831 | 0.830 | 0.913 |
| | Max | — | 4.354 | 1.641 | 3.878 | 4.042 | 2.951 | 4.071 |
| SAT | Time | 14955 | 25256 | 13067 | 9228 | 8269 | 12637 | 7313 |
| | Speedup | — | 0.592 | 1.144 | 1.620 | 1.808 | 1.157 | 2.044 |
| | Min | — | 0.067 | 0.168 | 0.509 | 0.751 | 0.411 | 0.523 |
| | Max | — | 4.437 | 3.900 | 5.287 | 11.749 | 1.326 | 5.900 |
| ALL | Time | 23618 | 39835 | 21676 | 16954 | 14971 | 19695 | 15247 |
| | Speedup | — | 0.593 | 1.089 | 1.393 | 1.578 | 1.182 | 1.549 |
| | Min | — | 0.067 | 0.168 | 0.509 | 0.751 | 0.411 | 0.523 |
| | Max | — | 4.437 | 3.900 | 5.287 | 11.749 | 1.326 | 5.900 |

In the table, the "Native" column shows the search times of the native, non-adaptive search using the default decision heuristic. The "-sign" column shows the search times of another non-adaptive search, which used the "-sign" option for all cases. The remaining columns of the table correspond to particular metrics. Results are also shown separately for the satisfiable and unsatisfiable formulas in the suite. In addition to the overall speed-up ratio, which is aggregated over the 50 formulas, the minimum (worst) and maximum (best) speed-up ratios for individual formulas are also shown.

It can be seen from the table that the BIN and UNARY metrics gave the best overall results, providing speed-up ratios of ~1.6 and ~1.5, respectively. Using the CCS, BIN, and UNARY metrics, higher speed-up ratios were achieved on satisfiable formulas than on unsatisfiable formulas. Within the satisfiable formulas alone, the UNARY metric achieved a 2× speed-up ratio, while on the unsatisfiable formulas it provided only marginal gain. On the other hand, the BCP metric performed better on the unsatisfiable formulas. The "-sign" option is, as expected, not recommended as a default option, since it significantly increases the overall run time.

Examining the minimum and maximum speed-up ratios reveals how the overall speed-up is achieved. The adaptive solving method significantly reduces the search times on some formulas, and only slightly increases the search times on others. The aggregated effect over the entire body of 50 formulas is a speed-up of up to 60%.

For example, the worst damage the BIN version causes is a speed-up of 0.75 (which equals to an increase of ~33% in the computation time of the specific formula), while its best performance achieves a speed-up ratio of almost 12. All of the examples in the benchmark suite are non-trivial. The best speed-up was achieved on an example that runs 3821 seconds on the native version, and 325 seconds with the BIN version.

When analyzing the speed-up ratios of individual formulas (not shown in the table, which only shows accumulated results), some of the metrics (in particular the CCS, BIN and UNARY metrics) perform better on the longer, higher-complexity formulas. For short formulas, the performance is typically mixed between slightly improved and slightly degraded computation times. When accumulated over the entire 50 formulas, the adaptive solving method provides significant computational speed-up over the non-adaptive "native" search.

Although the methods and systems described herein mainly address bounded model checking of hardware designs, the principles of the present invention can also be used in other types of formal verification. For example, the adaptive solving methods and the SAT solver described herein can be used to perform different types of unbounded verification processes (sometimes referred to as unbounded model checking) as well as Combinational Equivalence Checking (CEC) processes, as known in the art. In such applications, the SAT solver is used as a decision procedure for Boolean formulas. Typically, the verification problem, or part of it, is represented in terms of Boolean constraints provided to the SAT solver for solving.

In other applications, the SAT solver is used for extracting the "unsatisfiable core" of an unsatisfiable formula. Some of these applications use interpolation methods, such as Craig interpolation. The use of Craig interpolation in model checking applications is described, for example, by McMillan in "Interpolation and SAT-based Model Checking," Proceedings of the Fifteenth Conference on Computer-Aided Verification (CAV'03), Boulder, Colo., July 2003, (in volume 2725 of Lecture Notes in Computer Science, Somenzi and Hunt, eds., pages 1-13).

The principles of the present invention can also be used for model checking of other designs, such as software designs, as well as in other applications that use SAT solving techniques in modeling and solving target systems of other types. Such applications comprise, for example, various artificial intelligence applications, computer-assisted design (CAD) applications and many others.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A computer-implemented method for solving a satisfiability (SAT) problem, comprising:
    defining a formula, comprising variables, which refers to properties of a target system;
    performing a search process using a SAT solver having a search strategy over possible value assignments of the variables for a satisfying assignment that satisfies the formula;
    during the search process, periodically evaluating a predetermined switching condition with respect to a performance metric and an associated threshold, over a search segment that was processed in the search process, wherein the performance metric is indicative of at least one effectiveness measure selected from a group of effectiveness measures consisting of a computational efficiency and a memory size requirement of the search process that was carried out by the SAT solver over the search segment;

modifying the strategy of the search process responsively to the evaluated switching condition; and determining, based on the search process, whether the formula is satisfiable on the target system.

2. The method according to claim 1, wherein defining the formula comprises generating a bounded model checking (BMC) instance, and wherein determining whether the formula is satisfiable comprises verifying a hardware design of the target system by searching for a counterexample that violates at least one of the properties.

3. The method according to claim 1, wherein defining the formula comprises representing the formula in a conjunctive normal form (CNF), and wherein performing the search process comprises performing a search process based on a Davis-Putnam-Longman-Loveland (DPLL) method.

4. The method according to claim 1, wherein the performance metric comprises at least one metric selected from a group of metrics consisting of an average decision level, an average conflict clause size, a number of conflict clauses, a percentage of binary conflict clauses, a Boolean constraint propagation (BCP) efficiency metric, and a number of permanent value assignments.

5. The method according to claim 1, wherein modifying the strategy comprises determining whether to modify the strategy responsively to the performance metric.

6. The method according to claim 5, wherein modifying the strategy comprises modifying the switching condition so as to limit a frequency of subsequent strategy modifications.

7. The method according to claim 1, wherein modifying the strategy comprises modifying at least one of a decision heuristic, a clause addition strategy, a clause deletion strategy, a restart strategy, a BCP strategy, a conflict clause learning strategy and a strategy for setting a numerical parameter.

8. The method according to claim 1, wherein modifying the strategy comprises setting the modified strategy for performing the search process in another search segment subsequent to the search segment.

9. The method according to claim 1, wherein performing the search comprises performing at least one of applying an unbounded model checking process, applying a combinational equivalence checking process, and extracting an unsatisfiable core of the formula.

* * * * *